(12) United States Patent
Kijima et al.

(10) Patent No.: US 7,715,728 B2
(45) Date of Patent: May 11, 2010

(54) OPTICAL TRANSMITTER, OPTICAL COMMUNICATION SYSTEM AND METHOD FOR ADJUSTING OPTICAL TRANSMITTER

(75) Inventors: Masaru Kijima, Kanagawa (JP);
Kazuhiro Sakai, Kanagawa (JP);
Tsutomu Hamada, Kanagawa (JP);
Yoshihide Sato, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 776 days.

(21) Appl. No.: 11/581,703

(22) Filed: Oct. 16, 2006

(65) Prior Publication Data

US 2007/0280702 A1 Dec. 6, 2007

(30) Foreign Application Priority Data

Jun. 5, 2006 (JP) .......................... P2006-156103

(51) Int. Cl.
*H01S 3/13* (2006.01)
(52) U.S. Cl. .................. 398/182; 372/34; 372/29.015; 372/38.02
(58) Field of Classification Search ......... 398/182–201; 372/29.015, 38.02
See application file for complete search history.

(56) References Cited

U.S. PATENT DOCUMENTS

| | | | | | |
|---|---|---|---|---|---|
| 4,450,554 | A | * | 5/1984 | Steensma et al. | 398/54 |
| 5,062,059 | A | * | 10/1991 | Youngblood et al. | 709/217 |
| 5,062,151 | A | * | 10/1991 | Shipley | 398/108 |
| 5,107,362 | A | * | 4/1992 | Motoshima et al. | 398/197 |
| 5,311,005 | A | * | 5/1994 | Visocchi | 250/205 |
| 5,502,298 | A | * | 3/1996 | Geller | 250/205 |
| 5,974,063 | A | * | 10/1999 | Yoshida | 372/38.02 |
| 6,292,497 | B1 | * | 9/2001 | Nakano | 372/29.015 |
| 6,609,842 | B1 | * | 8/2003 | Kimbrough | 398/195 |
| 6,697,400 | B2 | | 2/2004 | Nomura | |
| 6,795,458 | B2 | * | 9/2004 | Murata | 372/26 |
| 6,885,685 | B2 | * | 4/2005 | Hidaka et al. | 372/38.02 |
| 7,106,768 | B2 | * | 9/2006 | Murata | 372/38.02 |
| 7,366,368 | B2 | * | 4/2008 | Morrow et al. | 385/15 |
| 7,369,587 | B2 | * | 5/2008 | Stewart et al. | 372/29.02 |
| 7,426,224 | B2 | * | 9/2008 | Ishibashi | 372/29.01 |
| 2004/0131094 | A1 | * | 7/2004 | Miremadi | 372/29.02 |
| 2007/0160095 | A1 | * | 7/2007 | Kitagawa et al. | 372/29.012 |
| 2007/0248130 | A1 | * | 10/2007 | Ishibashi | 372/38.07 |
| 2007/0280702 | A1 | * | 12/2007 | Kijima et al. | 398/192 |

FOREIGN PATENT DOCUMENTS

| | | |
|---|---|---|
| JP | 07-111355 | 4/1995 |
| JP | 9-214043 | 8/1997 |
| JP | 09-312441 | 12/1997 |
| JP | 2002-237649 | 8/2002 |

\* cited by examiner

*Primary Examiner*—Ken N Vanderpuye
*Assistant Examiner*—Danny W. Leung
(74) *Attorney, Agent, or Firm*—Fildes & Outland, P.C.

(57) ABSTRACT

An optical transmitter includes a light-emitting element, a driving circuit, a temperature detection unit, a storage device and a control circuit. The driving circuit causes, based on an input signal, the light-emitting element to emit an optical signal having a pulse shape. The temperature detection unit detects an ambient temperature of the light-emitting element. The storage device stores temperature characteristics information of the light-emitting element. The control circuit controls the driving circuit based on the ambient temperature detected by the temperature detection unit and the temperature characteristic information stored in the storage device, so that an extinction ratio of the optical signal having the pulse shape becomes substantially constant.

8 Claims, 8 Drawing Sheets

OPTICAL TRANSMITTER, OPTICAL COMMUNICATION SYSTEM AND METHOD FOR ADJUSTING OPTICAL TRANSMITTER

BACKGROUND

1. Technical Field

The invention relates to an optical transmitter for performing communication by generating optical signals having a pulse shape from a light-emitting element; an optical communication system; and a method for adjusting the optical transmitter.

2. Description of the Related Art

In the optical communication, in order to assure transmission quality, it is necessary to maintain an average light properly in the optical transmission.

FIG. 7 shows examples of waveforms of output signals having a pulse shape emitted from a light-emitting element. FIG. 7A shows ideal waveforms. FIG. 7B shows waveforms in the case where an extinction ratio is lowered although an average light intensity of the output signals is the same as that in FIG. 7A.

The output signals having the pulse shape emitted from the light-emitting element take either an H level or an L level. As shown in FIG. 7A, an average value of a light intensity P1 corresponding to the H level and a light intensity P0 corresponding to the L level constitutes an average light intensity. As the average light intensity is larger, the optical signals are less susceptive to noise. However, it has been known that even through the average light intensity of the output signals is equal to or larger than a predetermined value, when an extinction ratio "re" of the output signals is lowered, the transmission state of communication deteriorates. Here, the extinction ratio "re" is expressed by the following formula, $$re = 10 \times \log(P1/P0) \quad (1)$$

FIG. 8 illustrates relationships between a driving current and a light intensity. As shown in FIG. 8, light-emitting characteristics of the light-emitting element includes a spontaneous emission region 5a where light intensity does not almost increase even if the driving current is increased and a stimulated emission region 5b where light intensity greatly increases with an increase in the driving current. Further, the light-emitting characteristics of the light-emitting element has such a temperature dependency that an inclination of the curve (slope efficiency $\eta$) in the simulated emission region 5b varies in response to temperatures. When the slope efficiency $\eta$ varies, the extinction ratio "re" also varies. Further, the extinction ratio "re" also varies depending upon variations of respective elements in a driving circuit.

The slope efficiency $\eta$ stands for a ratio $\Delta P/\Delta I$ of an increase $\Delta P$ in the light intensity to an increase $\Delta I$ in the current in the stimulated emission region 5b shown in FIG. 8. As shown in FIG. 8, the slope efficiency $\eta$ decreases when the temperature increases, and increases when the temperature decreases.

SUMMARY

According to an aspect of the invention, an optical transmitter includes a light-emitting element, a driving circuit, a temperature detection unit, a storage device and a control circuit. The driving circuit causes, based on an input signal, the light-emitting element to emit an optical signal having a pulse shape. The temperature detection unit detects an ambient temperature of the light-emitting element. The storage device stores temperature characteristics information of the light-emitting element. The control circuit controls the driving circuit based on the ambient temperature detected by the temperature detection unit and the temperature characteristic information stored in the storage device, so that an extinction ratio of the optical signal having the pulse shape becomes substantially constant.

BRIEF DESCRIPTION OF THE DRAWINGS

Exemplary embodiments of the invention will be described in detail with reference to accompanying drawings wherein:

FIG. 7 shows waveforms of output signals of a light-emitting element.

DETAILED DESCRIPTION

First Exemplary Embodiment (Configuration of An Optical Transmitter)

Figure 1:
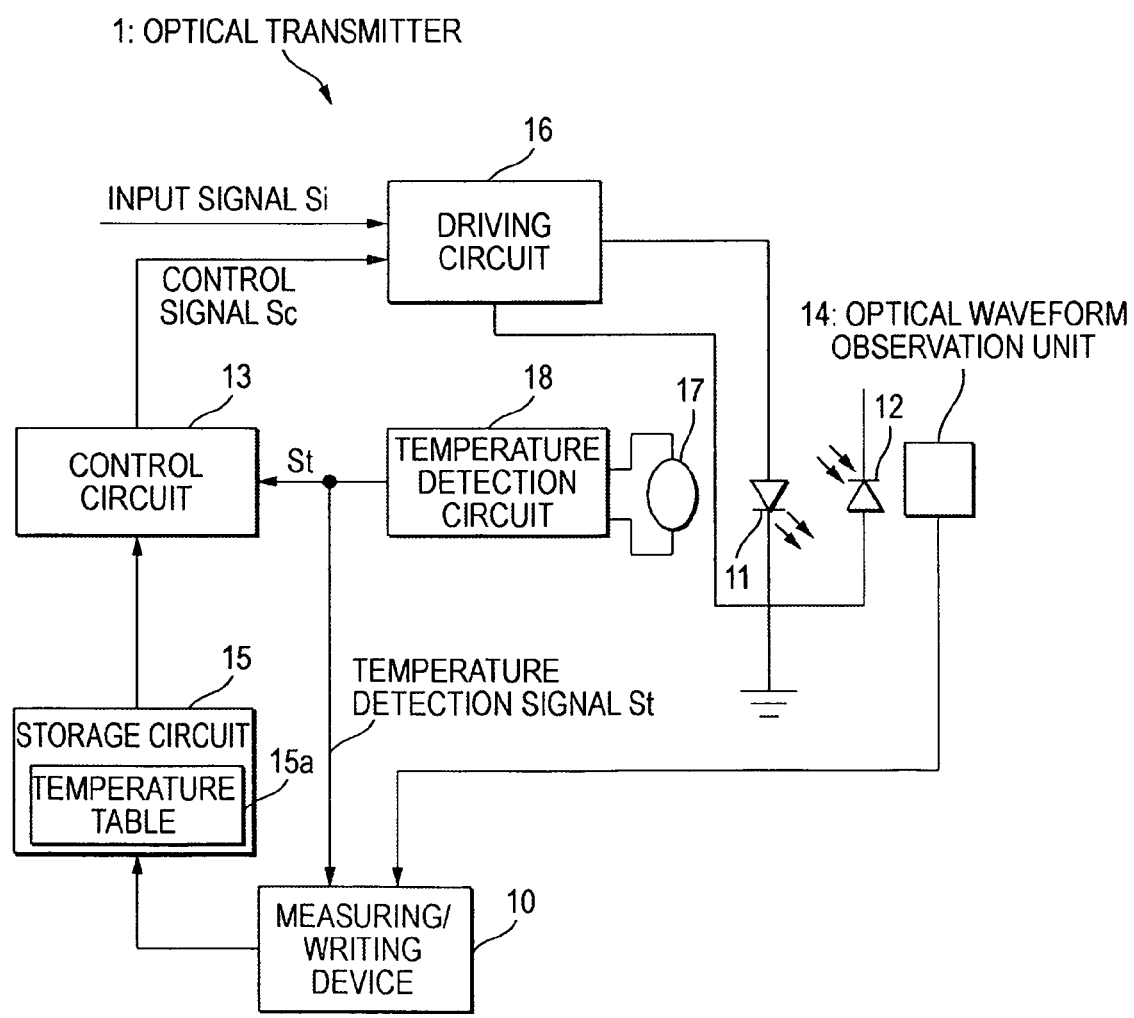
FIG. 1 is a block diagram illustrating an optical transmitter according to a first exemplary embodiment of the invention.

FIG. 1 shows an optical transmitter according to a first exemplary embodiment of the present invention. The optical transmitter includes a light-emitting element 11 such as a laser diode or a light-emitting diode, a light-receiving element 12 such as a photodiode that monitors an intensity of light emitted from the light-emitting element 11, a storage circuit 15 that stores a temperature table 15a, a driving circuit 16 that drives the light-emitting element 11 based on input signals Si, a temperature detection element 17 that detects an environmental temperature (ambient temperature) in the vicinity of the light-emitting element 11, a temperature detection circuit 18 that outputs a temperature detection signal St based on an output signal from the temperature detection element 17 and a control circuit 13 that controls the driving circuit 16. The respective circuits and the light-receiving element 12 are supplied with electric power from a power-source circuit (not shown).

At the time of writing into the temperature table 15a, a measuring/writing device 10 is temporarily connected to the optical transmitter 1.

The measuring/writing device 10 includes an observation unit 14 that observes waveforms of light emitted from the light-emitting element 11. The measuring/writing device 10 measures extinction ratios at respective temperatures based on the temperature detection signal St from the temperature detection circuit 18 and the extinction ratio obtained from the observation unit 14. Then, the measuring/writing device 10 writes the driving current conditions (drive conditions) at the respective temperatures under which the extinction ratio becomes constant, into the temperature table 15*a* in the storage circuit 15.

The light-receiving element 12 is connected at least on the anode side thereof to the driving circuit 16 so as to flow current through the light-receiving element in response to an average light intensity of optical signals emitted from the light-emitting element 11.

Figure 7A:
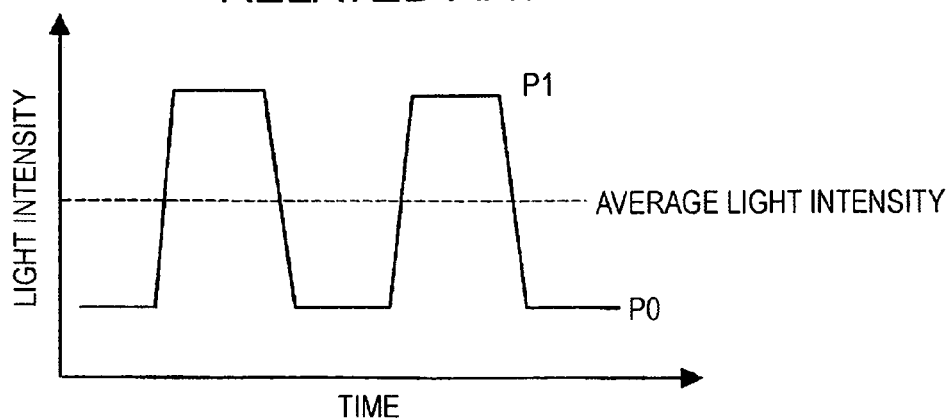
FIG. 7A is a waveform diagram showing an ideal waveform and FIG. 7B is a waveform diagram showing waveforms when an average light intensity is the same as that in FIG. 7 but the extinction ratio has decreased.
Figure 7B:
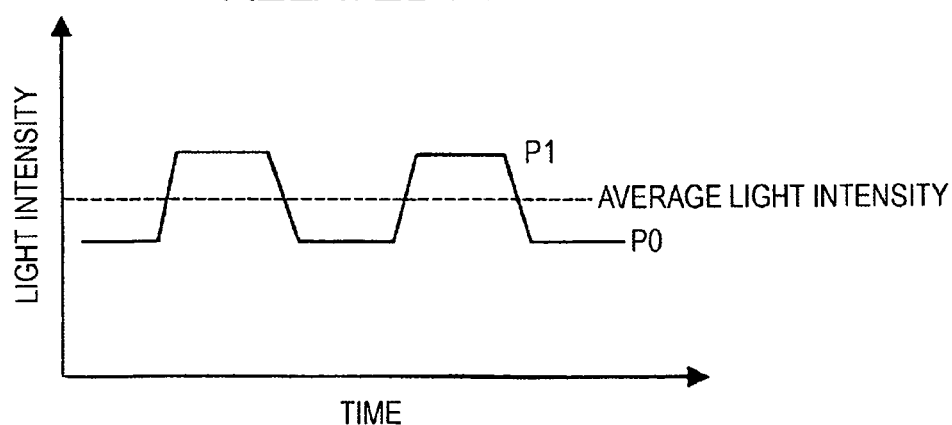
Figure 8:
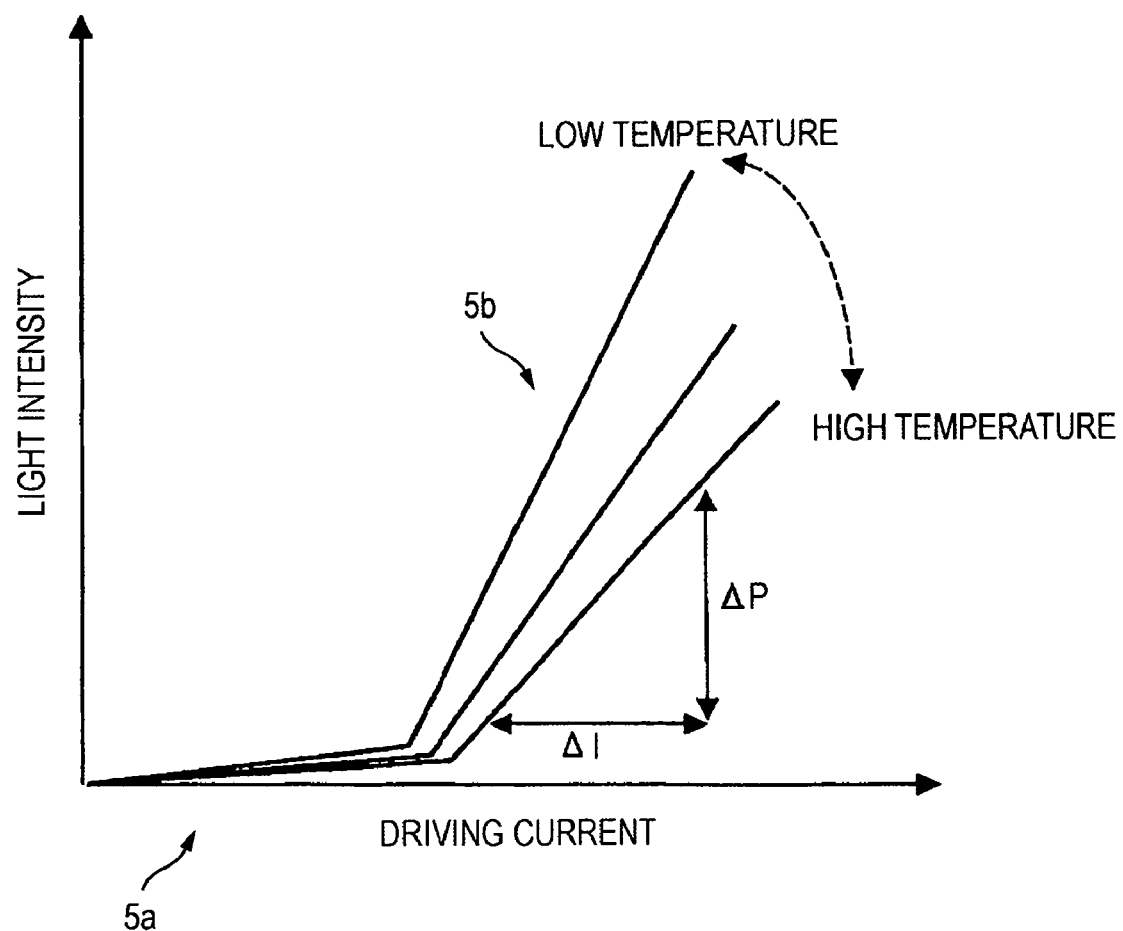
FIG. 8 is a characteristic diagram showing relationships between the driving current and the emitted light intensity.

The driving circuit 16 is formed of, for example, a transistor or a drive IC. The driving circuit 16 drives the light-emitting element 11 based on the input signals Si so as to emit optical signals having a pulse shape. In accordance with the control signals Sc from the control circuit 13, the driving circuit 16 further drives the light-emitting element 11 so as to maintain the extinction ratio shown in FIG. 7 substantially constant.

The temperature detection element 17 includes a thermistor and an IC temperature sensor. The temperature detection element 17 causes current, voltage and resistance to vary in accordance with the temperature. The temperature detection element 17 is, desirably, disposed to be as close to the light-emitting element 11 as possible.

The temperature detection circuit 18 converts a signal output from the temperature detection element 17 into a voltage corresponding to the temperature, and outputs the converted voltage as a temperature detection signal St to the control circuit 13. The temperature detection element 17 and the temperature detection circuit 18 may serve as a temperature detection unit.

The light-receiving element 12 monitors the average light intensity of light emitted from the light-emitting element 11. The control circuit 16 controls the light-emitting element 11 so that the average light intensity shown in FIG. 7 becomes substantially constant. Also, the control circuit 13 outputs the control signals Sc to the driving circuit 16 based on the temperature detection signals St from the temperature detection circuit 18 and contents of the temperature table 15*a* so as to maintain the extinction ratio substantially constant. The control circuit 13 may include a CPU and a ROM. The ROM may store software for controlling the driving circuit 16. The control circuit 13 may control the driving circuit so as to maintain the average light intensity in a predetermined range. Also, the control circuit 13 may control the driving circuit 16 so as to maintain the extinction ratio in a predetermined range.

The storage circuit 15 may includes a nonvolatile semiconductor memory and memory controller. The temperature table 15*a* may be stored in the semiconductor memory. A manufacturer of the light transmitter 1 connects the measuring/writing device 10 to the light transmitter 1 and writes the temperature table 15*a* into the light transmitter 1 at the shipping stage or the product testing stage. Instead of the semiconductor memory, another type storage media such as memory card or a hard disk device may be used.

Figure 2:
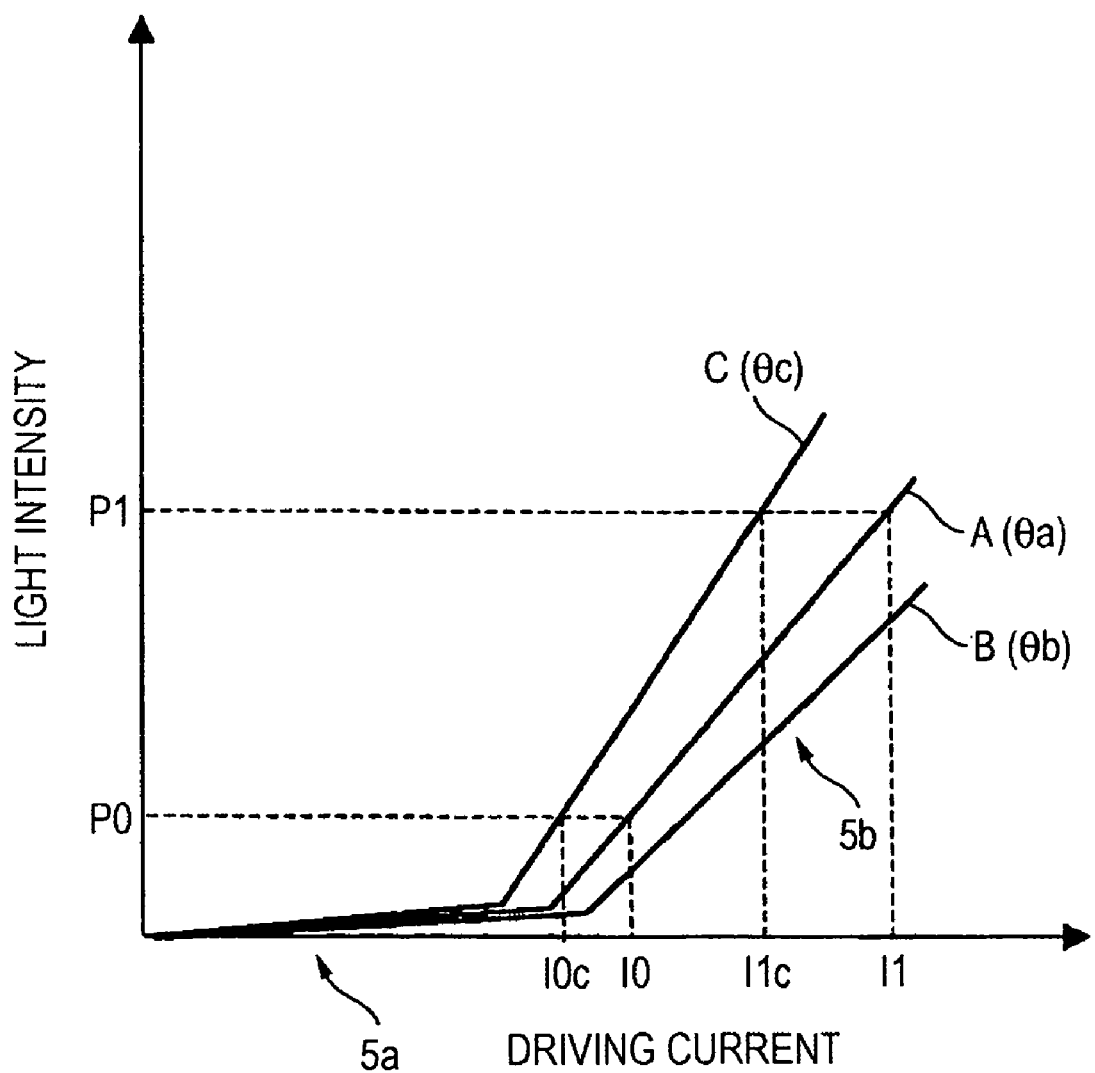
FIG. 2 is a characteristic diagram showing relationships between a driving current and an emitted light intensity.

FIG. 2 shows relationships between the driving current applied to the light-emitting element 11 and the intensity of light emitted from the light-emitting element 11. In FIG. 2, a reference sign "A" indicates light-emitting characteristics of the light-emitting device 11 at a standard temperature (θa), a reference sign "B" indicates light-emitting characteristics of the light-emitting element 11 at a high temperature (θb) and a reference sign "C" indicates light-emitting characteristics of the light-emitting element 11 at a low temperature (θc). As will be obvious from the characteristics A, B and C, the emitting light intensity varies depending on the temperature. As shown in FIG. 2, the light-emitting characteristics of the light-emitting element 11 include a spontaneous emission region 5*a* where the emitting light intensity does not almost increase even if the driving current is increased and a stimulated emission region 5*b* where the emitted light intensity greatly increases with an increase in the driving current. In the stimulated emission region 5*b*, the emitting light intensity P increases in proportion to the driving current I. The light-emitting element 11 is used in the stimulated emission region 5*b*. FIG. 2 only shows three characteristics A, B and C. However, a large number of data of light emission characteristics (temperature characteristics information) are measured in practice at different temperatures. Then, driving current conditions (drive conditions) under which a change in the extinction ratio caused by the temperature characteristics of the light-emitting element 11 is cancelled are written into the temperature table 15*a*.

In FIG. 2, P0 represents a target emitted light intensity when the input signal Si is at the L level, and P1 represents a target emitted light intensity when the input signal Si is at the H level. Also, I0 represents a driving current corresponding to the emitting light intensity P0, and I1 represents a driving current corresponding to the emitted light intensity P1. Here, an inclination of the curve in the stimulated emission region 5*b*, that is, the slope efficiency η(θ) can be expressed by $$\eta(\theta) = (k \cdot \Delta P)/\Delta I \quad (0.2 < k < 2) \tag{2}$$

where ΔP denotes a difference (P1−P0) in the emitted light intensity, ΔI denotes a difference (I1−I0) in the driving current, η(θ) denotes a slope efficiency of the light-emitting element at an ambient temperature θ, an L level and k denotes a coefficient.

also, the above formula (2) may be expressed as below, $$\Delta I = (k \cdot \Delta P / \eta(\theta)) \quad (0.2 < k < 2) \tag{3}$$

Figure 3:
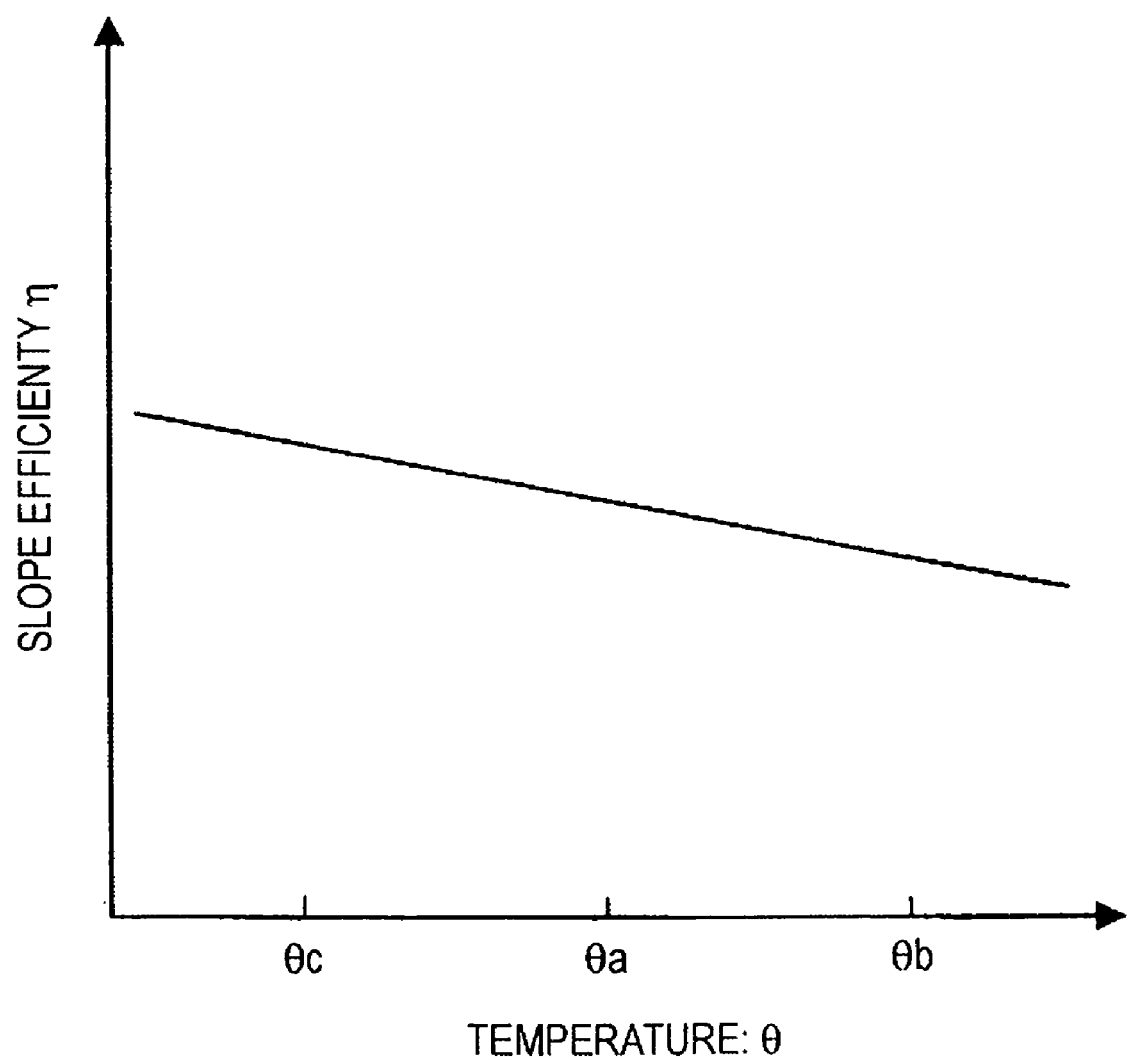
FIG. 3 is a characteristic diagram showing a relationship between the temperature and the slope efficiency.

FIG. 3 shows a relationship between the temperature and the slope efficiency. As shown in FIG. 3, the slope efficiency η has such a characteristic that the slope efficiency η decreases when the temperature θ increases. In FIG. 3, θa, θb and θc are temperatures corresponding to those shown in FIG. 2, and represent the standard temperature, the high temperature and the low temperature, respectively.

(Process of Obtaining Data of Light Emission Characteristics of the Light-Emitting Element at Respective Temperatures and Writing the Data Into the Temperature Table)

First, temperature dependency of light emission characteristics of the light-emitting element 11, which is used in the optical transmitter 1, is measured in advance at least in a range of working temperatures. Thereby, data relating to temperature dependency of the slope efficiency of the light-emitting element 11 (FIG. 3) is obtained. From the data of temperature dependency of the slope efficiency, a table is prepared which includes respective temperatures and relative values of an amplitude of driving currents at the respective temperatures with respect to an amplitude of driving current at a certain temperature (see table 1 described later).

Specifically, as shown in FIG. 2, the relation between the driving current of the light-emitting element 11 and the light intensity of the light-emitting element 11 has temperature dependency. The slope efficiency of the light-emitting element 11, that is, a ration of an increase of the light intensity to an increase of the driving current decreases as the temperature increases. FIG. 3 shows change in the slope efficiency of the light-emitting element 11 against change in the temperature.

If the temperature dependency of the slope efficiency of the light-emitting element 11 has already been obtained, (i) respective temperatures and (ii) values normalized by dividing inverses of the slope efficiencies at the respective temperatures by an inverse of the slope efficient at the predetermined temperature are stored in the table form. Also, if the temperature dependency of the slope efficiency of the light-emitting element 11 has not been obtained, the table may be prepared in the following manner. The temperature detection element 17 outputs current or voltage and a resistance value in accordance with the ambient temperature of the light-emitting element 11. The temperature detection circuit 18 converts a signal from the temperature detection element 17 into voltage, and sends the converted voltage as a temperature detection signal St to the measuring/writing device 10. At the same time, the driving circuit 16 drives the light-emitting element 11 based on the input signal Si, and the light-emitting element 11 emits optical signals having a pulse shape. The light-receiving element 12 outputs current in accordance with the average light intensity of optical signals emitted from the light-emitting element 11.

The L level and H level of the optical signals are observed by using the wideband light waveform observation unit 14 such as an optical oscilloscope. Results of the observation are input into the measuring/writing device 10. Contents of the temperature table 15a stored in the storage circuit 15 are determined by the measuring/writing device 10 so as to obtain driving current conditions (drive conditions) under which the extinction ratio be comes constant within the working temperature.

The measuring/writing device 10 obtains the temperature detection signal St and the L level and H level of the optical signals corresponding to the L level and H level of the input signals Si. Then, the measuring/writing device 10 obtains the slope efficiency of the light-emitting element 11 from a difference between the L level and H level of the optical signals and amplitude of the driving current, which is obtained from the input signals Si. If the above-described measurement is performed at the respective temperatures, the temperature dependency of the slope efficiency of the light-emitting element 11 can be obtained. After the temperature dependency of the slope efficiency of the light-emitting element 11 is obtained, measuring/writing device 10 writes (i) the temperatures and (ii) the values normalized by dividing the inverses of the slope efficiencies at the respective temperatures by the inverse of the slope efficient at the predetermined temperature are stored into the temperature table 15a in the table form. Therefore, the temperature table 15a may serve as a temperature table for correcting the temperature dependency A to C shown in FIG. 2.

The measuring/writing device 10 may write, into the temperature table 15a of the storage circuit 15, values obtained by multiplying the thus-obtained table (see Table 1 described later) of relative values of driving currents by the drive conditions of the light-emitting elements as temperature data of drive conditions of the light-emitting elements. For example, it is assumed that a driving current of a certain light-emitting element at 26° C., which provides an appropriate extinction ratio, is equal to 8.0 mA. In this case, the respective driving currents (7.84 mA and 8.08 mA) of this light-emitting element at 25° C. and 27° C. can be obtained by multiplying 8.0 mA by 0.98 and 1.01, which are the relative values stored in Table 1. Then, the measuring/writing device 10 writes the temperatures (25° C., 26° C. and 27° C.) and the obtained driving current (7.98 mA, 8.0 mA and 8.08 mA) into the temperature table 15a of the storage circuit 15.

(Operation of the Optical Transmitter)

Next, the operation of the optical transmitter 1 will be described. The driving circuit 16 drives the light-emitting element 11 based on the input signals Si. The light-emitting element 11 emits optical signals having a pulse shape. The light-receiving element 12 outputs current corresponding to the level of an average light intensity of the optical signals emitted from the light-emitting element 11.

Upon receipt of a monitor signal from the light-receiving element 12, the driving circuit 16 controls the light-emitting element 11 so as to maintain the average intensity of light emitted from the light-emitting element 11 constant.

The temperature detection element 17 outputs current or voltage and a resistance value in accordance with the ambient temperature of the light-emitting element 11. The temperature detection circuit 18 converts the current from the temperature detection element 17 into voltage and outputs the converted voltage as a temperature detection signal St to the control circuit 13.

The control circuit 13 refers to the temperature table 15a of the storage circuit 15 based on the temperature detection signal St from the temperature detection element 17, and outputs the control signals Sc to the driving circuit 16 so as to maintain the extinction ratio constant.

For example, it is presumed that the temperature detected by the temperature detection element 17 is a low temperature θc. In this case, the control circuit 13 refers to the characteristic C shown in FIG. 2, causes the driving circuit 16 to supply driving current I0c to the light-emitting element 11 so that the light intensity at the L level becomes P0 and causes the driving circuit 16 to supply driving current I1c to the light-emitting element 11 so that the light intensity at the H level becomes P1.

In the first exemplary embodiment, the driving current conditions (drive conditions) at the respective temperatures are stored in the temperature table 15a. However, the temperature dependency of slope efficiency η shown in FIG. 3 may be stored in the temperature table 15a. In this case, the control circuit 13 may calculate a driving current condition (drive condition) under which the extinction ratio is maintained constant, based on the temperature obtained by the temperature detection circuit 18 and the slope efficiency η stored in the temperature table 15a. Also, the driving current conditions (drive conditions) at the respective temperatures are not limited to the table format, but may be stored in the storage circuit 15 in the form of an operation formula. In this case, the control circuit 13 may obtain a optimum driving current based on the operation formula and controls the driving circuit 16 based on the obtained driving current.

Further, when the ambient temperature of the light-emitting element 11 is outside the predetermined temperature range, the control circuit 13 may adjust the driving current.

Second Exemplary Embodiment (Configuration of Optical Communication System)

Figure 4:
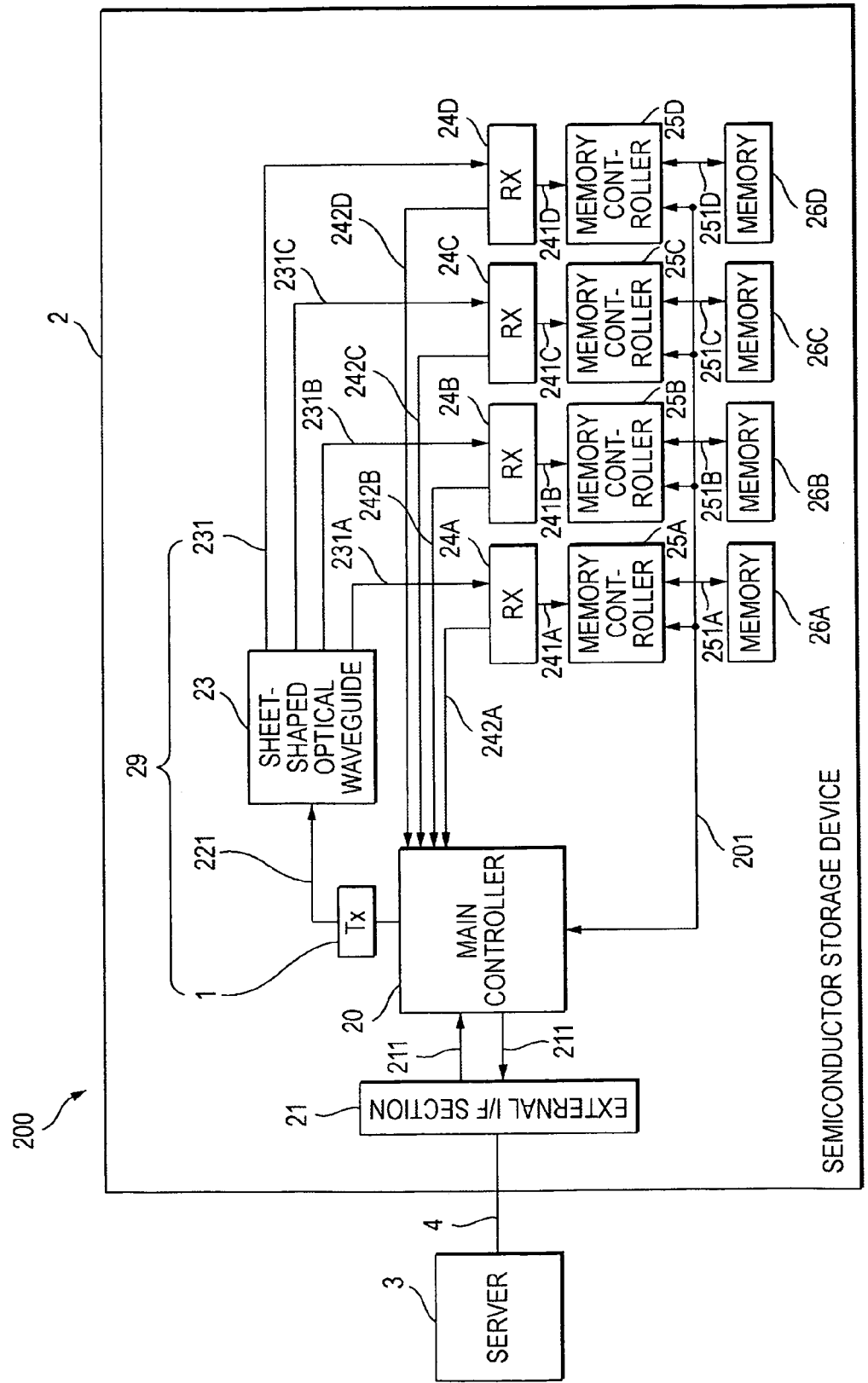
FIG. 4 is a block diagram showing an optical communication system according to a second exemplary embodiment of the invention.

FIG. 4 shows an optical communication system according to a second exemplary embodiment of the invention. This communication system 200 includes a server 3, which serves as an information processor, and a semiconductor storage device 2 connected to the server 3 via a serial interface 4.

The semiconductor storage device 2 includes a main controller 20, the optical transmitter (TX) 1, an external interface section 21 (external I/F section), a sheet-shaped optical waveguide 23, opto-electric conversion section (RX) 24A to 24D, memory controllers 25A to 25D and memories 26A to 26D. The main controller 20 serves as a control unit for executing the control operation in the unit 2. The optical transmitter (Tx) 1 is connected to the main controller 20. The optical transmitter 1 converts data (electric signals) into optical signals. The external interface section 21 exchanges signals with the optical transmitter 1 under the control by the main controller 20. The sheet-shaped optical waveguide 23 is coupled to the optical transmitter 1 via an optical fiber 221. The opto-electric conversion sections 24A to 24D are coupled to the sheet-shaped optical waveguide 23 via optical fibers 231A to 231D. The memory controllers 25A to 25D are connected to the opto-electric conversion sections 24A to 24D via signal lines 241A to 241D. The memories 26A to 26D are connected to the memory controllers 25A to 25D via memory buses 251A to 251D.

In FIG. 4, an optical memory bus 29 includes the optical transmitter 1, the optical fiber 221, the sheet-shaped optical waveguide 23, the optical fibers 231A to 231D and the opto-electric conversion sections 24A to 24D.

The main controller 20 may include a CPU and a ROM for storing programs. A control bus 201 is connected between the main controller 20 and the memory controllers 25A to 25D to transmit memory access control signals and initialization signals. The main controller 20 is further connected to the external I/F section 21 via signal lines 211.

The external I/F section 21 is equipped with a circuit for communicating with the optical transmitter 1 by a predetermined communication method.

The sheet-shaped optical waveguide 23 is configured so as to branch light input from the optical transmitter 1 into the four optical fibers 231A to 231D. The sheet-like waveguide 23 is made of a sheet-shaped transparent medium having a uniform thickness, which is a plastic material such as polymethyl methacrylate, polycarbonate or amorphous polyolefin, or an inorganic glass. The sheet-shaped optical waveguide 23 may have a clad layer on the side surfaces thereof and on the upper and lower surfaces thereof. Further, a diffusion layer may be provided on the side of the incident end of the sheet-shaped optical waveguide 23.

Each of the opto-electric conversion sections 24A to 24D includes a photodiode (PD), an amplifier for amplifying output signals of the PD and a demodulator for demodulating the output signals of the amplifier.

Each of the memory controller 25A to 25D is equipped with a circuit for controlling a process of writing and reading of data into and from the memories 26A to 26D. The control bus 201 connecting the main controller 20 to the memory controllers 25A to 25D is used by the main controller 20 as a bus for controlling the memory controllers 25A to 25D.

The memories 26A to 26D may be volatile semiconductor memories. The memories 26A to 26D are mounted on the same packages as the memory controllers 25A to 25D, and write and read data through the memory controllers 25A to 25D.

(Operation of the Second Exemplary Embodiment)

Next, the operation of the communication system 200 according to the second exemplary embodiment will be described below. When the server 3 outputs a transmission request to the semiconductor storage device 2, the main controller 20 receives this transmission request through the external I/F interface 21.

Upon completion of procedure for the transmission request, the main controller 20 receives data from the server 3 and outputs the received data to the optical transmitter 1. When there is no transmission request, the main controller 20 executes other processes including a standby process.

The optical transmitter 1 converts the received data into optical signals and sends the converted optical signals to the optical fiber 221 together with address data of a destination. The optical signals that have propagated through the optical fibers 221 are optically branched into the optical fibers 231A to 231D through the sheet-shaped optical waveguide 23.

The opto-electric conversion sections 24A to 24D convert the respective optical signals that have propagated through the optical fibers 231A to 231D into electric signals. Then, the opto-electric conversion sections 24A to 24D send the converted electric signals to the memory controllers 25A to 25D. The memory controllers 25A to 25D write the electric signals into the corresponding memories 26A to 26D based on header addresses.

The reading operation will be described next. When the server 3 output a request for reading data, the semiconductor storage device 2 sends signals for controlling the request for reading, to the memory controllers 25A to 25D through the control bus 201. When the request for reading includes the addresses of the memory controllers 25A to 25D, the memory controllers 25A to 25D read the corresponding data from the memories 26A to 26D, and send the read data to the main controller 20 through the control bus 201. The main controller 20 transfers the data received from the control bus 201 to the server 3.

EXAMPLE 1

Table 1 shows relative values of modulation currents corresponding to the respective temperatures, which are written into the temperature table 15a according to Example 1 of the invention. The "modulation current" is a current component obtained by subtracting a direct current component corresponding to the average light intensity from the driving current.

TABLE 1

| Temperature (° C.) | Relative values of driving currents |
|---|---|
| . | . |
| . | . |
| . | . |
| 25 | 0.98 |
| 26 | 1.00 |
| 27 | 1.01 |
| . | . |
| . | . |
| . | . |

In Table 1, each relative value of the modulation current are a relative value of a difference $\Delta I$ between driving current $I1$ of the H level and driving current $I0$ of the L level when the relative value at a given temperature is set to be 1.00. For example, it is assumed that 26° C. is used as a reference temperature as shown in Table 1. If (I1–I0) at 26° C. is denoted by $\Delta I1$ and (I1–I0) at 25° C. is denoted by $\Delta I2$, a relative value $\Delta I2/\Delta I1$ of the driving current is 0.98. Therefore, the driving current $I1$ of the H level and the driving current $I0$ of the L level are set by multiplying a difference value (I1–I0) in the driving current I at the reference temperature (26° C.) by 0.98 times. Further, if (I1–I0) at 27° C. is denoted by $\Delta I3$, $\Delta I3/\Delta I1$ is 1.01. Therefore, the driving current $I1$ of the H level and the driving current $I0$ of the L level are set by multiplying a difference value (I1–I0) in the driving current at the reference temperature (26° C.) by 1.01 times. The control circuit 13 drives the driving circuit 16 so that the above described relative values ($\Delta 1=I1–I0$) of the driving current I can be obtained.

Figure 5:
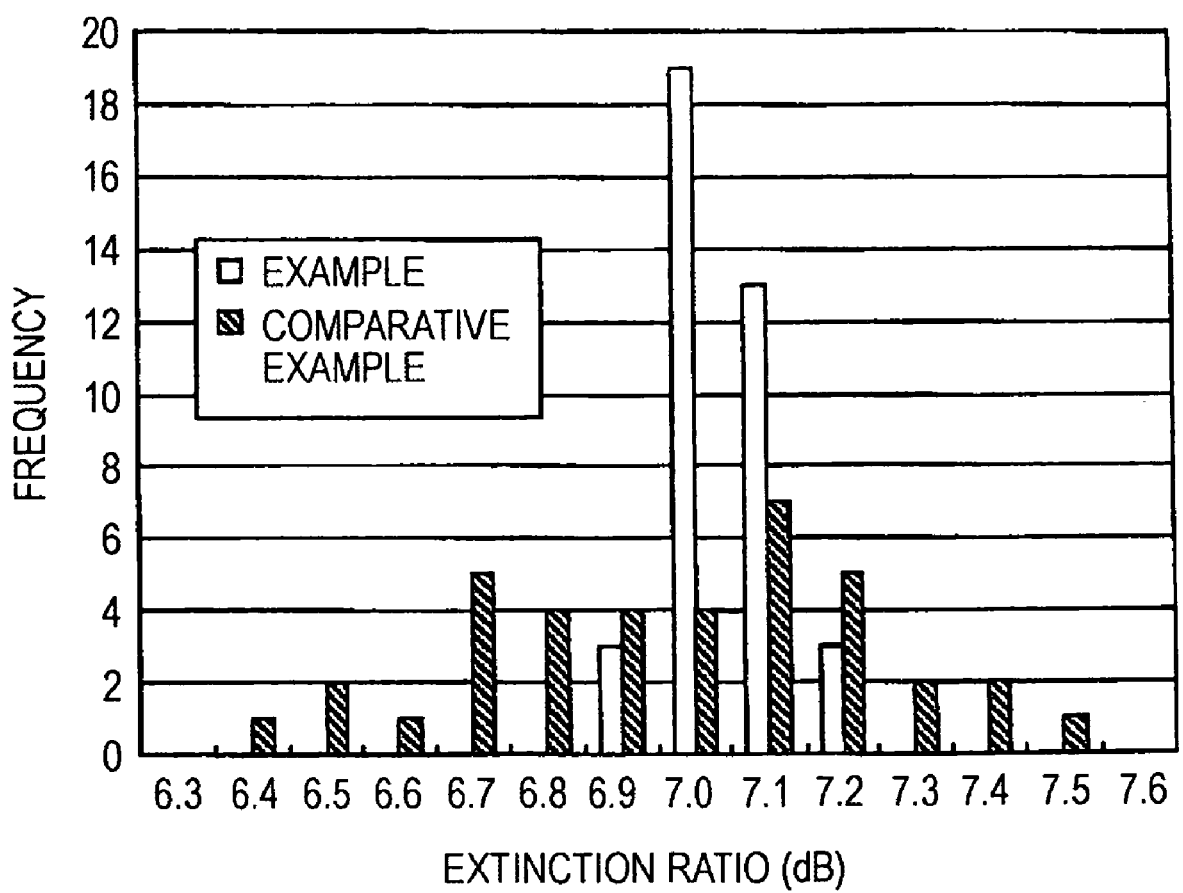
FIG. 5 is a histogram showing variations in the extinction ratio in Example and in Comparative Example.

FIG. 5 shows Examples and Comparative Examples. FIG. 5 is a histogram of sample number N=38 when the extinction ratio re of the optical transmitter 1 is evaluated by setting the extinction ratio "re" to 7.0 dB. In Comparative Example, the light-emitting element 11 is driven only by the driving circuit 16. That is, Comparative Example has the same configuration as that shown in FIG. 1 except for the control circuit 13. Comparative Example does not include the control circuit 13. Variation about ±0.5 dB occur relative to the extinction ratio "re"=7.0 dB. This is due to variations in the characteristics of the light-emitting element 11 and the characteristics of the driving circuit 16. On the other hand, in Examples, the variations are suppressed to be less than ±0.2 dB relative to the extinction ratio "re" of 7.0 dB.

Figure 6:
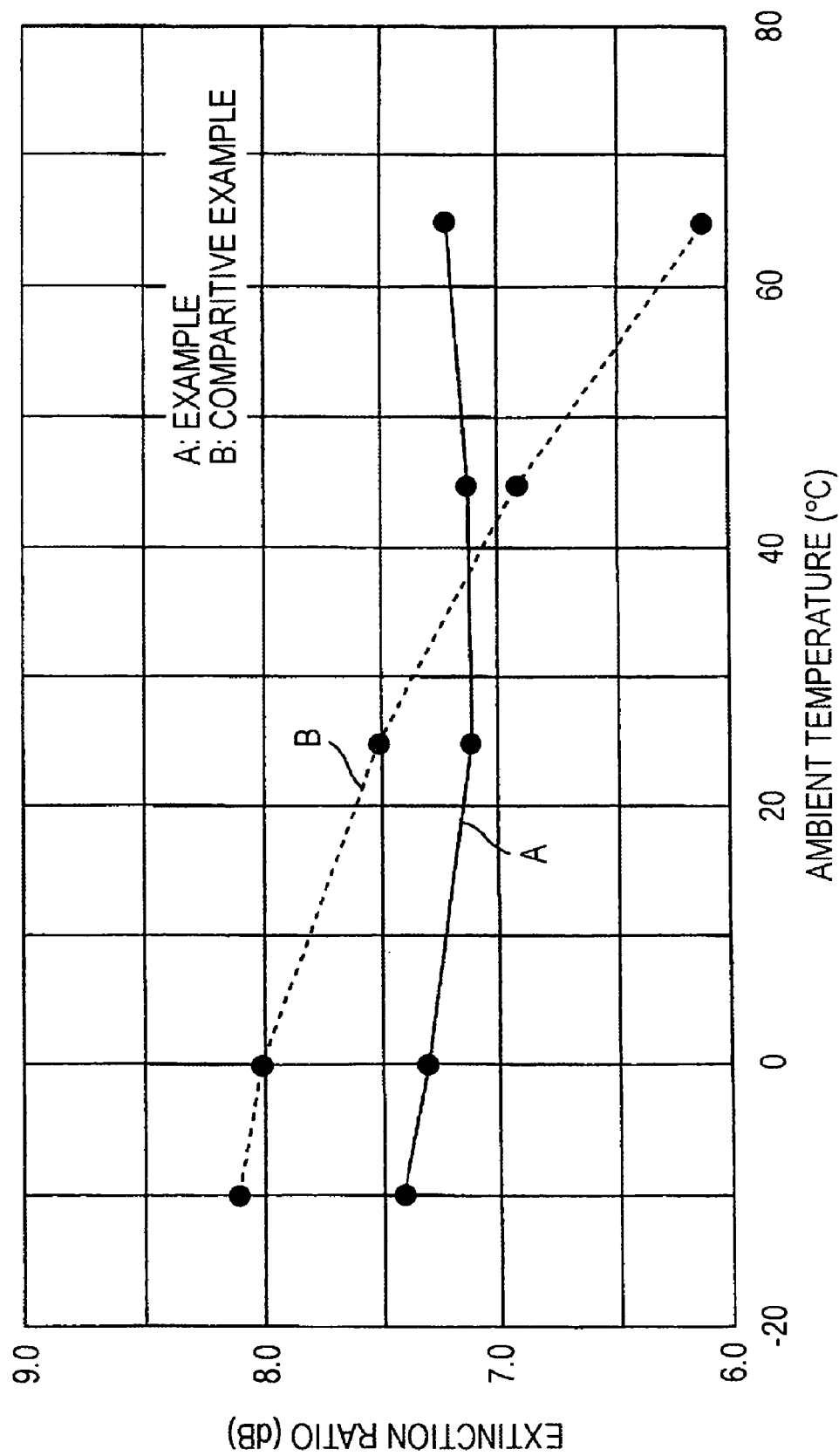
FIG. 6 is a characteristic diagram showing relationships between the extinction ratio and the temperature in Example and in Comparative Example.

FIG. 6 shows relationships between the extinction ratio re and the temperature θ in Examples and in Comparative Examples. In FIG. 6, the characteristics A are obtained in Examples, which use the configuration shown in FIG. 1. The characteristics B are obtained in Comparative Example when the control circuit 13 performs no control. As will be obvious from FIG. 6, the extinction ratio "re" in Examples remains nearly constant irrespective of change in the temperature while the extinction ratio "re" in Comparative Example varies depending upon change in the temperature.

Other Embodiments

The invention is not limited to the above described exemplary embodiments. The exemplary embodiments may be modified so long as the gist of the invention is not changed.

For example, the data of light emission characteristics of the light-emitting elements maybe written into the temperature table without incorporating the light-emitting elements into the optical transmitter.

What is claimed is:

1. An optical transmitter comprising:
    a light-emitting element;
    a driving circuit that causes, based on an input signal, the light-emitting element to emit an optical signal having a pulse shape;
    a temperature detection unit that detects an ambient temperature of the light-emitting element;
    a storage device that stores temperature characteristics information of the light-emitting element, the temperature characteristics information stored in the storage device being information in which ambient temperatures of the light-emitting element and driving currents flowing into the light-emitting element are associated with each other; and
    a control circuit that controls the driving circuit based on the ambient temperature detected by the temperature detection unit and the temperature characteristic information stored in the storage device, so that an extinction ratio of the optical signal having the pulse shape becomes substantially constant;
    wherein a relation between the ambient temperatures of the light-emitting element and modulation currents satisfies $\Delta I = (k \cdot \Delta P / \eta(\theta))$ where $\Delta I$ denotes the modulation current, $\eta(\theta)$ denotes a slope efficiency of the light-emitting element at an ambient temperature $\theta$, $\Delta P$ denotes a difference between a light intensity of the light-emitting element when the input signal takes a H level and a light intensity of the light-emitting element when the input signal takes an L level and $0.2 < k < 2$.

2. The optical transmitter according to claim 1, wherein the temperature characteristics information stored in the storage device is based on a value, which sets the substantially constant extinction ratio and is obtained by measuring the light-emitting element in a state where the light-emitting element is connected to the driving circuit.

3. The optical transmitter according to claim 1, wherein the temperature characteristics information stored in the storage device is information in which ambient temperatures of the light-emitting element and driving currents flowing into the light-emitting element are associated with each other.

4. The optical transmitter according to claim 1, further comprising:
    a light-intensity detecting unit that detects an average light intensity of the optical signal generated by the light-emitting element, wherein:
    the control circuit controls the driving circuit so that the extinction ratio of the optical signal having the pulse shape and the average light intensity of the optical signal become substantially constant.

5. An optical transmitter comprising:
    a light-emitting element;
    a driving circuit that causes, based on an input signal, the light-emitting element to emit an optical signal having a pulse shape;
    a temperature detection unit that detects an ambient temperature of the light-emitting element;
    a storage device that stores temperature characteristics information of the light-emitting element, the temperature characteristics information stored in the storage device being information in which ambient temperatures of the light-emitting element and driving currents flowing into the light-emitting element are associated with each other;
    a light-intensity detection unit that detects an average light intensity of the optical signal emitted from the light-emitting element; and
    a control circuit that controls the driving circuit based on the ambient temperature detected by the temperature detection unit and the temperature characteristic information stored in the storage device, so that an extinction ratio of the optical signal having the pulse shape becomes substantially constant, the control circuit that controls the driving circuit based on the average light intensity of the optical signal detected by the light-intensity detection unit so that the average light intensity of the optical signal having the pulse shape becomes substantially constant;
    wherein a relation between the ambient temperatures of the light-emitting element and modulation currents satisfies $\Delta I = (k \cdot \Delta P / \eta(\theta))$ where $\Delta I$ denotes the modulation current, $\eta(\theta)$ denotes a slope efficiency of the light-emitting element at an ambient temperature $\theta$, $\Delta P$ denotes a difference between a light intensity of the light-emitting element when the input signal takes a H level and a light intensity of the light-emitting element when the input signal takes an L level and $0.2 < k < 2$.

6. An optical communication system comprising:
    the optical transmitter according to claim 1; and
    an optical receiver that receives an optical signal from the optical transmitter via a light transmission medium.

7. An optical communication system comprising:
    a common bus that serially transmits data and comprises an optical transmitter including:
    a light-emitting element;
    a driving circuit that causes, based on an input signal, the light-emitting element to emit an optical signal having a pulse shape;
    a temperature detection unit that detects an ambient temperature of the light-emitting element;
    a storage device that stores temperature characteristics information of the light-emitting element; and a control circuit that controls the driving circuit based on the ambient temperature detected by the temperature detection unit and the temperature characteristic information stored in the storage device, so that an extinction ratio of the optical signal having the pulse shape becomes substantially constant;

an information processor connected to an upstream side of the common bus;

a plurality of memory controllers connected to a downstream side of the common bus, the memory controllers that convert signals between serial signals and parallel signals;

a plurality of memories connected to the plurality of memory controllers via signal lines for parallel signals; and wherein the temperature characteristics information stored in the storage device is information in which ambient temperatures of the light-emitting element and driving currents flowing into the light-emitting element are associated with each other; and a relation between the ambient temperatures of the light-emitting element and modulation currents satisfies $$\Delta I = (k\Delta P / \eta(\theta))$$

where $\Delta I$ denotes the modulation current, $\eta(\theta)$ denotes a slope efficiency of the light-emitting element at an ambient temperature $\theta$, $\Delta P$ denotes a difference between a light intensity of the light-emitting element when the input signal takes a H level and a light intensity of the light-emitting element when the input signal takes an L level and $0.2 < k < 2$.

8. A method for adjusting an optical transmitter, the method comprising:

detecting an ambient temperature of a light-emitting element that emits an optical signal having a pulse shape; and adjusting a driving current of the light-emitting element based on the detected ambient temperature of the light-emitting element and temperature characteristics information of the light-emitting element, so that an extinction ratio of the optical signal having the pulse shape emitted by the light-emitting element becomes substantially constant, wherein a relation between the ambient temperatures of the light-emitting element and modulation currents satisfies $$\Delta I = (k \cdot \Delta P / \eta(\theta))$$

where $\Delta I$ denotes the modulation current, $\eta(\theta)$ denotes a slope efficiency of the light-emitting element at an ambient temperature $\theta$, $\Delta P$ denotes a difference between a light intensity of the light-emitting element when the input signal takes a H level and a light intensity of the light-emitting element when the input signal takes an L level and $0.2 < k < 2$.

* * * * *